United States Patent [19]
Watanabe et al.

[11] Patent Number: 5,652,608
[45] Date of Patent: Jul. 29, 1997

[54] INK JET RECORDING HEAD, INK JET RECORDING HEAD CARTRIDGE, RECORDING APPARATUS USING THE SAME AND METHOD OF MANUFACTURING THE HEAD

[75] Inventors: Kenjiro Watanabe, Tokyo; Koji Yamakawa, Yokohama, both of Japan

[73] Assignee: Canon Kabushiki Kaisha, Tokyo, Japan

[21] Appl. No.: 712,178

[22] Filed: Sep. 11, 1996

Related U.S. Application Data

[63] Continuation of Ser. No. 102,996, Jul. 28, 1993, abandoned.

[30] Foreign Application Priority Data

Jul. 31, 1992 [JP] Japan .................................. 4-204919
Jan. 19, 1993 [JP] Japan .................................. 5-006984

[51] Int. Cl.⁶ .................................................. B41J 2/14
[52] U.S. Cl. ................................... 347/50; 439/493
[58] Field of Search ........................ 346/139 C; 347/50, 347/56, 57, 58, 86, 87; 439/67, 493

[56] References Cited

U.S. PATENT DOCUMENTS

| | | | |
|---|---|---|---|
| 4,313,124 | 1/1982 | Hara | 347/57 |
| 4,345,262 | 8/1982 | Shirato et al. | 347/10 |
| 4,459,600 | 7/1984 | Sato et al. | 347/47 |
| 4,463,359 | 7/1984 | Ayata et al. | 347/56 |
| 4,555,715 | 11/1985 | Vegeais et al. | 347/200 |
| 4,558,333 | 12/1985 | Sugitani et al. | 347/65 |
| 4,586,056 | 4/1986 | Okamura et al. | 347/208 |
| 4,608,577 | 8/1986 | Hori | 347/66 |
| 4,630,478 | 12/1986 | Watanabe | 73/299 |
| 4,634,195 | 1/1987 | Shoemaker | 339/17 F |
| 4,635,080 | 1/1987 | Watanabe | 347/50 |
| 4,723,129 | 2/1988 | Endo et al. | 347/56 |
| 4,740,796 | 4/1988 | Endo et al. | 347/56 |
| 4,914,562 | 4/1990 | Abe et al. | 346/140 R |
| 4,922,269 | 5/1990 | Ikeda et al. | 346/140 R |
| 5,182,580 | 1/1993 | Ikeda et al. | 347/19 |

FOREIGN PATENT DOCUMENTS

| | | |
|---|---|---|
| 0418817 | 3/1991 | European Pat. Off. . |
| 0546544 | 6/1993 | European Pat. Off. . |
| 0547596 | 6/1993 | European Pat. Off. . |
| 54-56847 | 5/1979 | Japan . |
| 59-123670 | 7/1984 | Japan . |
| 59-138461 | 8/1984 | Japan . |
| 60-71260 | 4/1985 | Japan . |
| 60-242073 | 12/1985 | Japan . |

*Primary Examiner*—Benjamin R. Fuller
*Assistant Examiner*—Craig A. Hallacher
*Attorney, Agent, or Firm*—Fitzpatrick, Cella, Harper & Scinto

[57] ABSTRACT

This specification discloses an ink jet recording head for discharging ink from discharge ports to thereby effect recording, characterized in that an element substrate having energy generating means for causing energy for discharting the ink in conformity with a recording signal to act on the ink and that portion of a flexible wiring substrate for transmitting the recording signal to the element substrate which is provided with a connecting terminal for the connection with the wiring substrate are disposed on one surface of a support member, a portion provided with a connecting terminal for effecting the electrical connection of the flexible wiring substrate to the apparatus side is disposed on the other surface of the support member by the flexible wiring substrate being bent, and the bent portion of the flexible wiring substrate has a slit portion which alleviates the bending reaction force of the flexible wiring substrate itself. The specification also discloses a method of manufacturing such ink jet recording head, and an ink jet recording apparatus using an ink jet recording head.

13 Claims, 12 Drawing Sheets

INK JET RECORDING HEAD, INK JET RECORDING HEAD CARTRIDGE, RECORDING APPARATUS USING THE SAME AND METHOD OF MANUFACTURING THE HEAD

This application is a continuation of application Ser. No. 08/102,996, filed Jul. 28, 1993, now abandoned.

BACKGROUND OF THE INVENTION

1. Field of the Invention

The present invention relates to a small size ink jet recording head and an ink jet recording head cartridge which are detachably mountable to a recording apparatus, and to a recording apparatus using the same.

2. Related Background Art

Recently, various recording systems have been developed. Among them, an ink jet recording system in which ink is ejected through ejection outlets in accordance with recording signal, is widely used because of the advantage of the small size and the low noise.

The recording head used in such an ink jet recording apparatus is in the form of a detachably mountable recording head cartridge from the standpoint of easy maintenance and service life or the like.

The recording head cartridge detachably mountable to the recording apparatus and the recording apparatus are electrically connected by electric connection contacts (connectors) for transmitting signals for driving the recording head from the recording apparatus. When the recording head is mounted on the recording apparatus, the contacts are electrically connected.

However, in the case of a detachably mountable recording head cartridge, there is a liability that the ink leaked through the ejection outlet contaminates the contacts with the result of insufficient electric connection.

In order to solve the problem, U.S. Pat. No. 4,635,080 discloses that the contacts are disposed on a surface which is different from an ejection side surface having the ejection outlets of a recording head cartridge having an integral ink container.

The recent demand for the small size of the recording apparatus requires a reduction in the size of the recording head cartridge. In this case, the ink capacity of an ink container constituting the recording head cartridge also decreases. In addition, there may be a difference in the service life of the ink container from that of the recording head which is also part of the head cartridge. Therefore, from the standpoint of cost and from the standpoint of re-use of the recording head, the recording head cartridge in which the ink container and the recording head are separable is considered.

The ink is supplied from the ink container to the recording head through an ink supply port. In addition, the driving signal is supplied by electric connections between the electric contacts of the recording head and the recording apparatus.

FIGS. 17 and 18 show an example of an ink jet recording head not using the present invention. The ink jet recording head is of a type in which electrothermal transducers are used as energy generating means, and ink droplets are ejected by bubble creation in the ink by the thermal energy produced by the electrothermal transducers. These figures show a recording head which is connectable to and separable from an ink container. A supporting plate 1 has a top surface to which an energy base plate and a wiring base plate 9 are bonded. The energy base plate (heater board) is made chiefly of Si or the like having on a surface thereof heat generating portions (heaters) of electrothermal transducers effective to generate thermal energy. The base plate 9 (Wiring board) is made chiefly of glass or epoxy resin material and is effective to transmit the electric signals from the main assembly of the recording apparatus to the heater board 2. The heater board 2 and the wiring board 9 are electrically connected together by wire bonding 7.

The top surface of the wiring board 9 is provided with contact pads (electric contacts) 4 electrically connected with a flexible wiring board of the main assembly of the recording apparatus.

The ink is supplied from an ink container or recording apparatus side through an ink supply member 6 to a common liquid chamber and ejection nozzles constituted by the bonding between the heater board 2 and a top plate 5, and the ink is ejected through the ejection outlets 8.

However, in such a recording head, an ink joint between an ink supply member 6 and an ink container or an ink supplying portion of the apparatus and a portion having the contact pads 4 of the wiring board 9 are disposed on the same side of the supporting plate 1. Therefore, when the recording head is connected or disengaged, the ink leaked from the ink joint may contact the contact pads with the result of insufficient or improper electric connection.

Recently, a further reduction in the size is desired. Since the number of pads and the area of each of the pads are more or less limited, it is difficult to further reduce the area occupied by the contact pads. In addition, the area of the recording head supporting plate is determined by the areas of the heater board portion, the wire bonding portion and the contact pad portion. For these reasons, further reduction in the size is not easy.

In order to solve such problems left to be solved, the inventors have previously proposed a recording head in which the disposition of an element substrate and a wiring substrate provided with energy generating means for generating energy available to discharge ink onto a support member is improved and a contact pad is formed on the side opposite to a surface on which the element substrate is disposed.

As a result of the inventor's further studies, it has been found that by improving the bending of the wiring substrate and the wiring thereof, the element substrate and the apparatus side can be electrically connected together by a more reliable and more positive method.

SUMMARY OF THE INVENTION

The present invention is based on the above-noted factor which has been found out, and an object thereof is to provide an ink jet recording head and an ink jet recording head cartridge which are more compact and can accomplish highly reliable and stable recording, and a recording apparatus using the same.

It is also an object of the present invention to provide an ink jet recording head and an ink jet head cartridge which are compact and highly reliable as well as easy to manufacture, a recording apparatus using these, and a method of manufacturing the ink jet recording head.

The epitome of the present invention for achieving such objects is an ink jet recording head having an element substrate having energy generating means for causing energy for discharging ink in conformity with a recording signal to act on the ink and a portion of a flexible wiring substrate for transmitting the recording signal to the element substrate which is provided with a connecting terminal for the connection with the wiring substrate are disposed on one surface of a support member. A portion is provided with a connecting terminal for effecting the electrical connection of the flexible wiring substrate to the apparatus side and is disposed on the other surface of the support member by the flexible wiring substrate being bent. The bent portion of the flexible wiring substrate is of a slit shape which alleviates the bending reaction force of the flexible wiring substrate itself. The invention includes ink jet head cartridge using such recording head, or an ink jet recording apparatus using such recording head.

In such an invention, the flexible wiring substrate is used as wiring means for transmitting a signal from the recording apparatus side to a heater board, and a contact pad portion for effecting electrical connections with the recording apparatus and a portion having the heater board mounted thereon are disposed on the different surfaces of a support plate, whereby the area of the support plate can be made small and further, the recording head and thus the recording apparatus can be made compact.

Also, the ink joint portion and the contact pad portion are separated into discrete areas and therefore, the contamination of the contact pad portion by the ink can be prevented and defective operation can be prevented.

Particularly, according to the present invention, the flexible wiring substrate is bent and fixedly held on the back of the support member and therefore, there is provided a slit for alleviating the bending reaction force of the flexible wiring substrate itself, whereby the contact pad portion can be stably located at a holding position on that surface of the support plate which is opposite to the surface on which the heater board is disposed.

Also, the present invention is an ink jet recording head wherein a substrate having on the surface thereof energy generating means for causing energy for discharging ink from a discharge port in conformity with a recording signal and recording the ink on a recording medium to act on the ink and a flexible wiring substrate for transmitting the recording signal from a recording apparatus body to the substrate through a connecting terminal are disposed on a support member, characterized in that the flexible wiring substrate is bent and the support member and the flexible wiring substrate are positioned and fixed on the back of the support member through both the adhesive film so that the connecting terminal may be disposed on that surface of the support member which is opposite to the surface on which the substrate is disposed.

Also, the present invention is a method of manufacturing an ink jet recording head wherein a substrate having on the surface thereof energy generating means for causing energy for discharging ink from a discharge port in conformity with a recording signal and recording the ink on a recording medium to act on the ink and a flexible wiring substrate for transmitting the recording signal from a recording apparatus body to the substrate through a connecting terminal are disposed on a support member, characterized in that the flexible wiring substrate is bent and the support member and the flexible wiring substrate are positioned and fixed on the back of the support member with both-side securing film interposed therebetween so that the connecting terminal may be disposed on that surface of the support member which is opposite to the surface on which the substrate is disposed.

Further, the present invention is an ink jet recording apparatus characterized by the provision of at least a recording head of the above-described construction in which an ink discharge port for discharging ink therethrough is provided in opposed relationship with the recording surface of a recording medium, and a member for supporting said recording head thereon.

In the above-described present invention, a flexible wiring substrate is used as wiring means for transmitting a signal from the recording apparatus side to the heater board, and a contact pad portion for effecting the electrical connection with a recording apparatus and a portion having the heater board mounted thereon are disposed on the different surfaces of a support member, whereby the area occupied exclusively by the support member relative to the apparatus body can be made small.

DESCRIPTION OF THE PREFERRED EMBODIMENTS

Some embodiments of the ink jet recording head of the present invention will hereinafter be described with reference to the drawings.

Figure 1A:
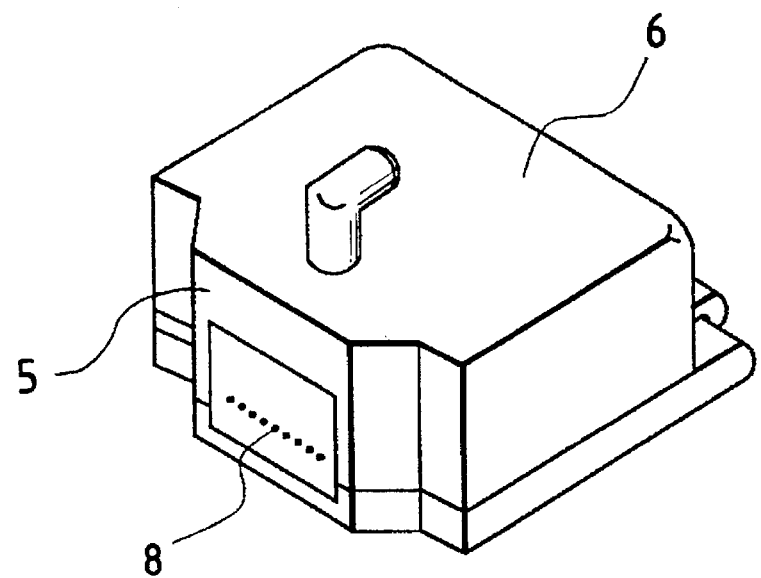
FIGS. 1A and 1B are pictorial views showing an ink jet recording head according to an embodiment of the present invention.
Figure 1B:
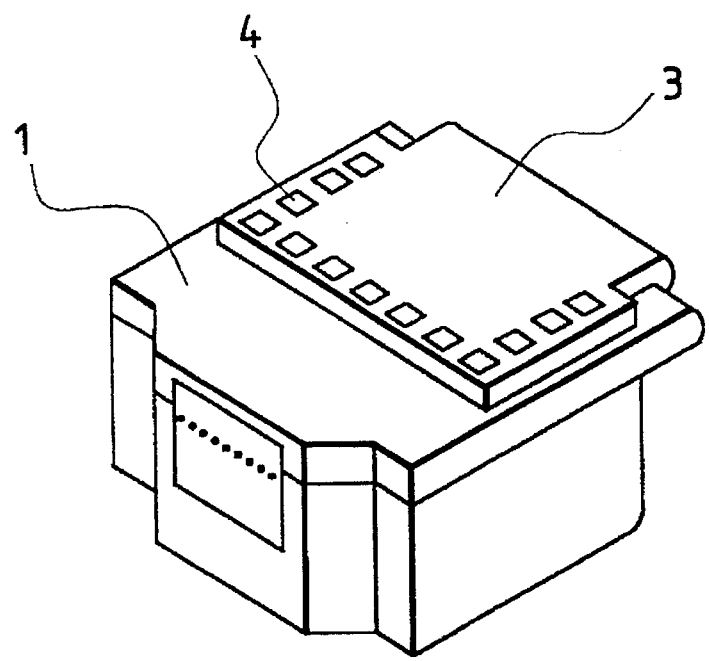

FIGS. 1A and 1B are a top perspective view and a bottom perspective view, respectively, of an ink jet recording head according to the present invention.

The general construction of the ink jet recording head of the present embodiment will first be described with reference to these figures.

A heater board 2 (an element substrate; see FIG. 2B) formed of a base material such as an Si substrate having an electro-thermal converting member (an energy generating element) generating energy available to discharge ink formed as film on the surface thereof is disposed on a portion of one surface of a support plate 1 formed of a metal such as aluminum.

A flexible wiring (FPC) substrate 3 formed chiefly of polyimide for transmitting an electrical signal sent from a recording apparatus body to the heater board 2 is disposed in such a manner that a surface thereof on which a connecting terminal connected to the heater board 2 is disposed lies on the same surface as that surface of the support member 1 on which the heater board 2 is disposed and a surface thereof on which is disposed a contact pad (connecting terminal) 4 which is a connecting portion with the recording apparatus side lies on that surface of the support member 1 which is opposite to the surface on which the heater board 2 is disposed. The heater board 2 and the FPC substrate 3 are connected together by wire bonding 7. A grooved top plate 5 for forming a flow path for directing the ink to the vicinity of the electro-thermal converting member is disposed on the heater board 2.

The ink is supplied from an ink supply portion or an ink tank disposed in the recording apparatus body through an ink supply member 6 to a common liquid chamber and a flow path formed by the heater board and the top plate 5 being joined together.

A signal from recording signal supply means on the recording apparatus side is supplied from the apparatus side through a contact pad 4 on the recording head side which contacts with the contact pad 4 (connecting terminal) of the flexible wiring substrate on the recording apparatus side when the recording head is carried on the apparatus. Along therewith, the electro-thermal converting member is driven, whereby the ink is heated and through discharge ports 8.

As described above, the flexible wiring substrate is turned back onto the surface opposite to that surface of the support plate on which the heater board is disposed, and the contact pad 4 of the flexible wiring substrate is disposed on the aforementioned opposite surface, whereby the support plate itself can be made small and thus, the recording head itself can be made compact.

Now, a reaction force against the turning-back of the flexible wiring substrate (a force which tends to release the turning-back) becomes greater as the support plate is made smaller, and the flexible wiring substrate may come off the support plate, whereby electrical connection may become bad. In contrast, in the present invention, two members as will be described below or a construction comprising a combination of these two members is added to thereby solve the above-noted problem.

(i) a flexible substrate with a slit

Figure 2A:
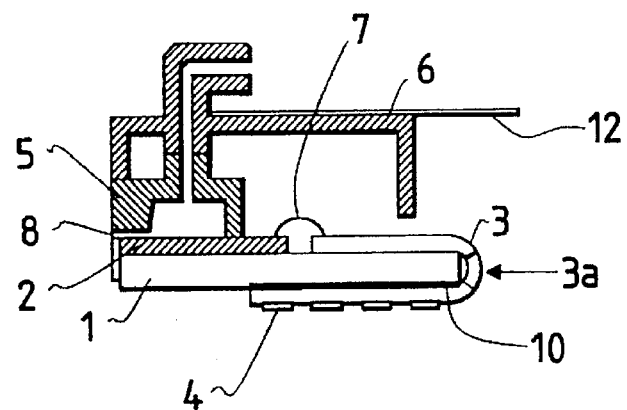
FIGS. 2A and 2B are a schematic cross-sectional view and a perspective view, respectively, showing an embodiment of the ink jet recording head according to the present invention.
Figure 2B:
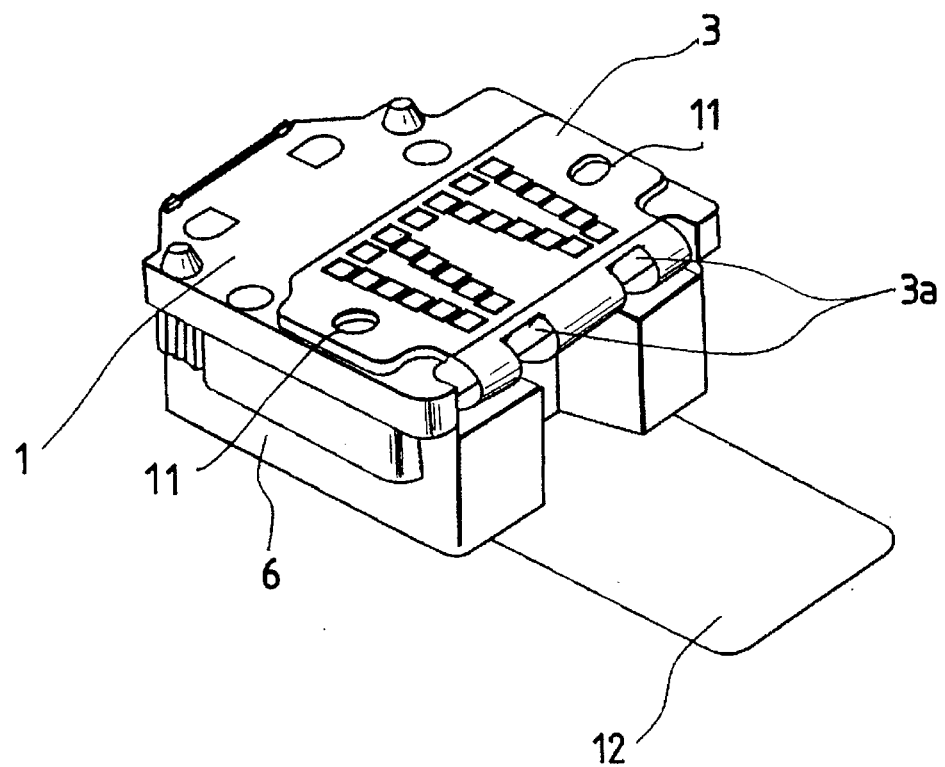

FIGS. 2A and 2B are a schematic cross-sectional view and a perspective view, respectively, of the ink jet recording head according to the present embodiment. In these figures, the same members are given the same reference numerals.

In the present embodiment, slit portions (opening portions) 3a are provided in the bent portion of the flexible wiring substrate to reduce the aforementioned reaction force of the flexible wiring substrate.

Figure 3:
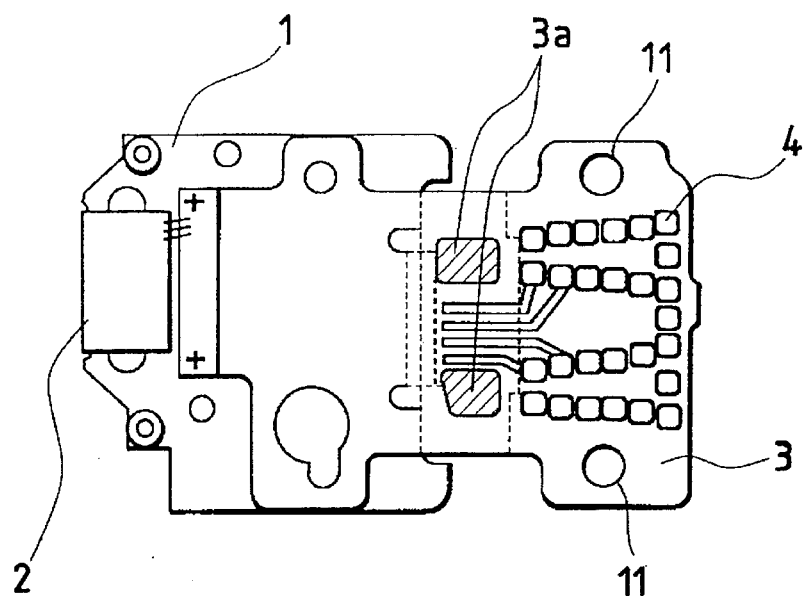
FIG. 3 shows a portion of a flexible wiring substrate on which a contact pad is disposed as it is not turned back onto the back of a support plate.

FIG. 3 shows that portion of the flexible wiring substrate on which the contact pad is disposed as it is not turned back onto the back of the support plate. The slit portions 3a are provided at two locations just corresponding to the turned-back portion of the flexible wiring substrate. Each corner of these slit portions is R-shaped (curved), whereby the provision of the slit portions may not damage the flexible wiring substrate. In the present embodiment, this R shape is R0.3 mm. The reference numeral 11 designates openings formed in the flexible wiring substrate, and with the openings in the support plate, these openings 11 provide a reference for positioning when the head is carried on the apparatus side. In the present embodiment, the dimension between the centers of these openings 11 and 15 mm.

Figure 4A:
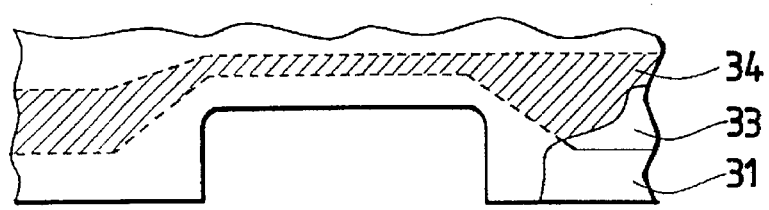
FIGS. 4A and 4B are a top plan view and a cross-sectional view, respectively, showing an embodiment of the ink jet recording head according to the present invention.
Figure 4B:
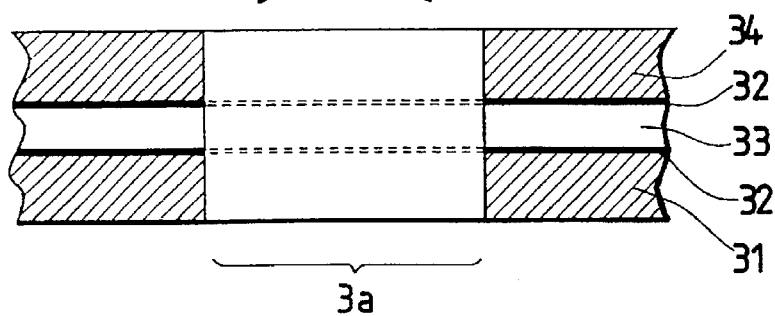

FIGS. 4A and 4B are a top plan view and a cross-sectional view, respectively, of the slit portion. As shown, the slit portion is formed as an aperture extending through the flexible wiring substrate comprising base film 31 of polyimide, copper foil 33 for wiring and cover film 34 of polyimide layered successively. The reference numeral 32 denotes an adhesive layer.

As described above, in the present embodiment, the slit portions (opening portions) are provided in the bent portion of the FPC substrate 3, whereby the contact pad can be easily and reliably disposed on the surface different from the heater board 2 and therefore, the both surfaces of the support plate 1 can be effectively utilized and the area of the support plate 1 can be reduced and thus, the recording head can be made compact and also, the recording head and the recording apparatus will suffer little from malfunctioning.

Also, the contact pad portion is disposed on the side opposite to the ink joint portion and therefore, the contamination of the pad portion by the ink can be prevented.

The manufacturing process for the recording head according to the present embodiment will now be described with respect to the essential portions thereof.

An adhesive agent such as a silicone adhesive agent like epoxy adhesive agent, SE9145 or SE4410 (produced by Tore Dow Corning Silicone, Inc.) is first applied to the necessary portion of one surface of a cleaned support member as by screen printing. The support member may be ceramics or glass, but may desirably be a metal such as Al.

Subsequently, the heater board 2 is positioned on and adhesively secured to one end portion of the surface to which the adhesive agent has been applied, and the wire bonding pad side is positioned on and adhesively secured to the other end portion of the same surface in such a manner as to protrude over half of the contact pad side of the FPC wiring substrate 3 (FIG. 3).

Thereafter, the heater board 2 and the connecting terminal of the wiring substrate 3 are connected together as by wire bonding 7.

A top plate is adhesively secured to the heater board to thereby form an ink path and a common liquid chamber, and the ink supply member 6 is connected to the top plate and is sealed by a sealant such as liquid silicone rubber.

Subsequently, both-side adhesive film 10 is positioned on and cemented in advance to the back of the support member, and the contact pad side of that portion of the FPC substrate 3 which protrudes from the support member is bent by 180° by a bending portion having a slit and is positioned on and superposedly urged against the adhesive film, and is adhesively secured to this film.

Figure 5:
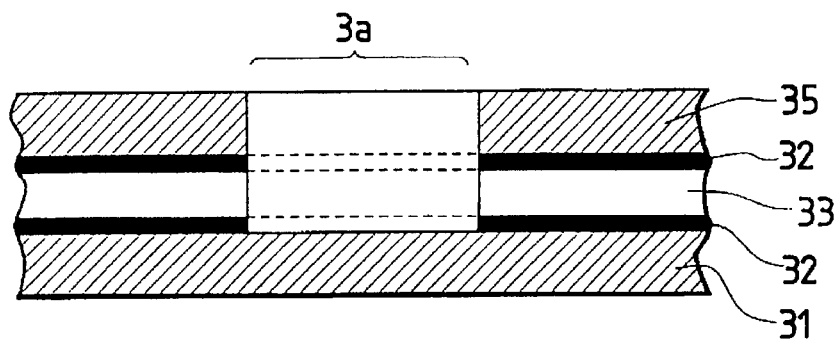
FIG. 5 is a cross-sectional view showing the construction of an embodiment of the ink jet recording head according to the present invention.

In the aforedescribed embodiment, the slit portions are provided at two locations in the bent portion of the flexible wiring substrate 3 shown in FIG. 4, but when this is viewed in terms of a layer construction, slits are formed in both of the base materials on the base film side and the cover film side of polyimide positioned above and below the flexible wiring substrate, whereas in the present embodiment, as shown in FIG. 5, a slit portion is not provided on the base film side, but is provided only on the cover film side.

As a result, as in the aforedescribed embodiment, the FPC substrate is bent onto the back of the support member and adhesively secured thereto and therefore, there is provided a slit shape which alleviates the bending reaction force of the FPC substrate itself, whereby the contact pad portion can be stably positioned and disposed on that surface of the support plate which is opposite to the surface on which the heater board is disposed, and split or the like may not occur from the slit.

(ii) both-side adhesive film

In each of the aforedescribed embodiments, the slit portions are provided in the bent portion of the flexible print substrate, whereby the reaction force of the flexible print substrate against bending is reduced and thereby, that portion of the flexible print substrate on which the contact pad position is disposed is reliably disposed on the back of the support plate (the surface opposite to the surface on which the heater board is disposed).

In contrast, in an embodiment which will now be described, the turned-back portion of the flexible print substrate is easily and reliably secured to the support member to thereby achieve the object. Described will hereinafter be made of such embodiment, which may be considered to be similar to the previous embodiments except for the construction of adhesive securement.

Figure 6:
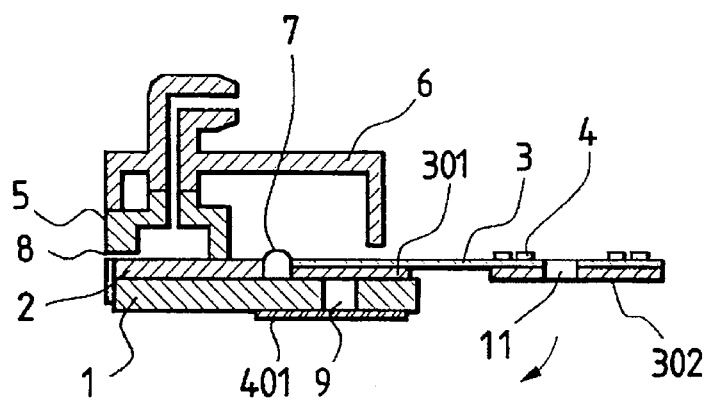
FIG. 6 is a cross-sectional view showing the construction of the ink jet recording head according to an embodiment of the present invention before a flexible wiring substrate is joined thereto.

FIG. 6 is a schematic cross-sectional view illustrating the general construction of the ink jet recording head of the present invention. A heater board 2 made chiefly of an Si substrate having a heater for causing heat energy to act on the ink formed as film and the lower portion of the wire bonding of a flexible wiring substrate 3 made chiefly of polyimide for transmitting an electrical signal sent from the recording apparatus body to the heater board 2 and having a reinforcing plate 30 of glass epoxy or the like joined to the back thereof are adhesively secured to the upper surface of a support member 1 comprising an aluminum plate or the like.

A positioning aperture 9 is formed in the support member 1, and a contact pad portion 4 for contact with the recording apparatus body, a reinforcing plate 302 and a positioning aperture 11 which has already been described in the previous embodiments are formed in that portion of the flexible wiring substrate 3 which protrudes from the support member.

Figure 7:
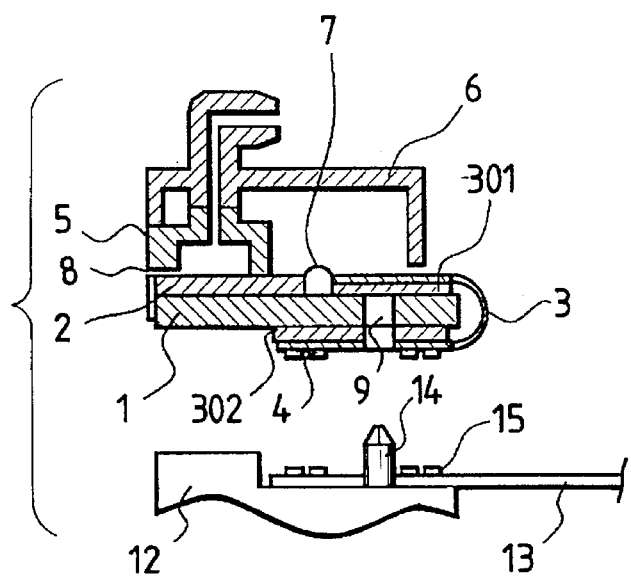
FIG. 7 is a cross-sectional view of the ink jet recording head after the flexible wiring substrate is joined thereto in the construction of FIG. 6.

Subsequently, that portion of the flexible wiring substrate 3 which protrudes from the ink supply member 6 is bent by 180° and is adhesively secured to the back of the support member 1 so that the contact pad portion 4 may be disposed on the back of the support member 1, as shown in FIG. 7.

The heater board 2 and the flexible wiring substrate 3 are connected together by wiring bonding 7, and the contact pad portion 13 of the flexible wiring substrate 12 of the recording apparatus body is contacted by the Contact pad portion 4 of the flexible wiring substrate 3, whereby an electrical signal is supplied.

The ink is supplied from an ink supply portion or an ink tank disposed in the recording apparatus body through the ink supply member 6 to a common liquid chamber and discharge ports 8 formed by the heater board 2 and the top plate 5 being joined together.

Figure 8:
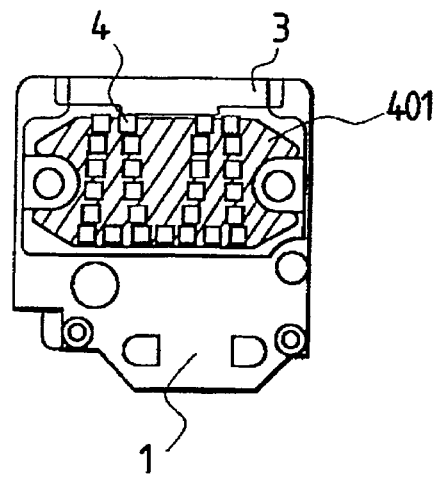
FIG. 8 shows an embodiment of the ink jet recording head according to the present invention.

Both-side adhesive film 401 is cemented to the back of the support member 1. Subsequently, that portion of the flexible wiring substrate 3 which protrudes from the support member 1 is bent by 180° and is adhesively secured to the back of the support member 1 while the positioning aperture 9 in the support member 1 and the positioning aperture 11 in the flexible wiring substrate 3 are positioned by the round pin of a securement positioning jig, not shown. FIG. 8 shows a schematic view in which the head is seen through the back thereof so that the disposition of the adhesive film can be seen. As described above, the heater board 2 and the flexible wiring substrate 3 are connected together by wire bonding 7, and the contact pad portion 13 of the flexible wiring substrate 12 of the recording apparatus body is contacted by the contact pad portion 4 of the flexible wiring substrate 3, whereby an electrical signal is supplied.

A flexible wiring substrate 13 is positioned and fixed on the carriage 12 of the recording apparatus body by a positioning pin 14.

Further, the positioning of the recording head is effected by the positioning pin 14 and the positioning apertures 9 and 11 of the recording head.

In the present embodiment, from such construction of the head, the flexible wiring substrate is positioned and fixed on the back of the support member.

For the fixing, use is made of acrylic adhesive securing means such as both-side adhesive means No. 5911 or No. 5916 (produced by Nitto Denko Co., Ltd.).

As performances required of such adhesive securing means, mention may be made of the stable securement holding property during securement against a repulsion caused by the flexible wiring substrate being bent onto the back side of the support member, and the chemical resistant property to ink components.

Thus, by the adoption of the both-side adhesive film, the flexible wiring substrate can be bent onto the back of the support member and be reliably secured thereto with the support member reduced in size, and the downsizing of the recording head can be achieved.

In the above-described embodiment, film of single-layer structure is used as the both-side adhesive film, and with the countermeasure for mass production in its actually mounted form taken into account, such film is made into the form of a tape in accordance with the area of the flexible wiring substrate on the fixed back side.

The working of adhesive film tape is such that an adhesive layer is stuck on released paper, the area of the stuck portion of the adhesive film layer is punched by a press, the other portion than the adhesive surface is removed and the tape is wound in the form of a roll with the adhesive film layer sandwiched by the released paper.

A problem in making such tape is that when the adhesive film is punched, both adhesive layers glue together in the cross-sections of the portion used as the adhesive tape and the portion to be removed and the adhesive layer of the portion to be removed pulls the adhesive layer around the glued portion used as the adhesive tape and therefore, it becomes impossible to hold an effective adhesive area.

Figure 9:
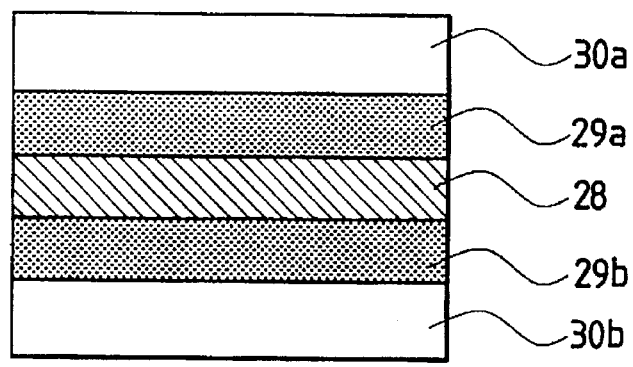
FIG. 9 is a schematic cross-sectional view of three-layer both-side adhesive film used in an embodiment of the present invention.

As a remedy for such adhesive film structure, use can be made of a modified three-layer structure type in which a discrete base material such as alkaliproof polyimide material which is not corroded by ink components (for example, trademark "YUPIREX" produced by Ube Kosan Co., Ltd.) is provided as an intermediate layer in the adhesive layer and the adhesive film material used in the first embodiment is disposed on and under it. FIG. 9 shows a schematic cross-sectional view of film of such three-layer structure. In FIG. 9, the reference characters 30a and 30b designate released paper, the reference characters 29a and 29b denote adhesive layers, and the reference numeral 28 designates an intermediate layer.

By using adhesive film of such structure, the press punching property in the manufacturing process is improved and reliability is enhanced in the actual mounting during production, and this also leads to a reduction in cost.

Figure 10:
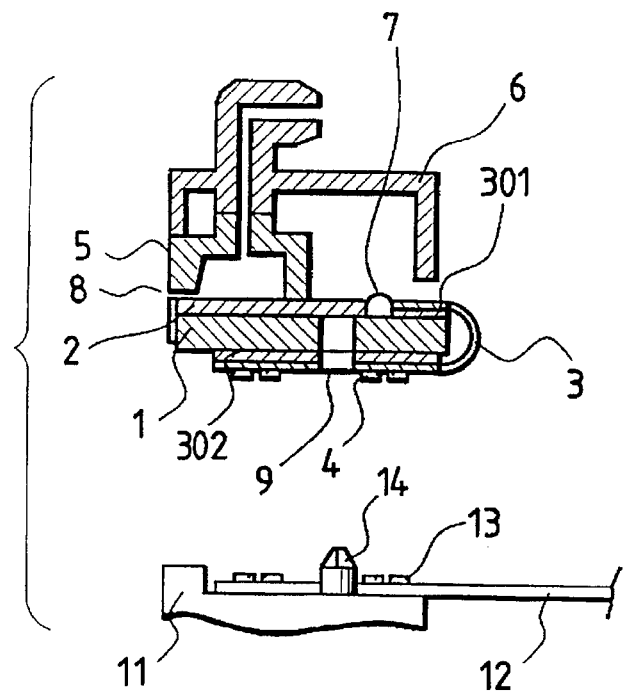
FIG. 10 is a cross-sectional view showing the construction of an ink jet recording head according to an embodiment of the present invention.

Description will now be made of an embodiment in which in order to make the recording head more compact, the location at which the flexible wiring substrate is adhesively secured to the back of the support member is brought close to the discharge ports of the recording head.

Where as shown in FIG. 10, the location at which the flexible wiring substrate is stuck on the back of the support member is brought close to the discharge ports of the recording head, it would occur to mind that ink slightly leaking out of the ink discharge ports 8 adheres to the end surface of the flexible wiring substrate 3. If the ink used in the ink jet recording head adheres to the end surface of the flexible wiring substrate, the flexible wiring substrate 3 may be corroded by a solvent such as alcohol contained in the ink or the adhesive force between the flexible wiring substrate 3 and the reinforcing plate 301 may be reduced, whereby the flexible wiring substrate 3 may peel.

In the present embodiment, in order to eliminate such an undesirable possibility and make the recording head more compact, polyimide film synthesized by the polycondensation of biphenyl tetracarboxylic acid dianhydride and diamine is used as the base material of the flexible wiring substrate, and discretely therefrom or together therewith, a phenol nitrile rubber adhesive agent is used to join the polyimide film and a reinforcing plate together.

As polyimide film synthesized by the polycondensation of biphenyl tetracarboxylic acid dianhydride and dyamine, use can be made, for example, of a commercially available material such as trademark "YUPIREX" (produced by Ube Kosan Co., Ltd.). This film, as compared with the conventional polyimide film, has features such as high hardness, low water absorbing property and high heat resistance and therefore, the reliability of wire bonding is enhanced.

Also, the phenol nitrile rubber adhesive agent, as compared with Ordinary acryl adhesive agents, is excellent in chemical resistance and high in heat resistance and therefore can further enhance the ink resisting property and reliability of the ink jet recording head.

Thus, by adopting the above described construction, further compactness of the recording head can be achieved.

While in the foregoing, description has been individually made of an embodiment in which slits are provided to reduce the bending reaction force of the flexible wiring substrate which increases as the support plate for the recording head is shortened and the head is made more compact, or the reliably adhesively secure the flexible wiring substrate by an easy process, and an embodiment which uses the both-side adhesive film, the both-side adhesive film of the previous embodiment is used at the location whereat the adhesive agent is disposed as indicated by the reference numeral 10 in FIG. 2, whereby the effects of the two can be synergistically obtained and thus, a more desirable form is provided.

Figure 11A:
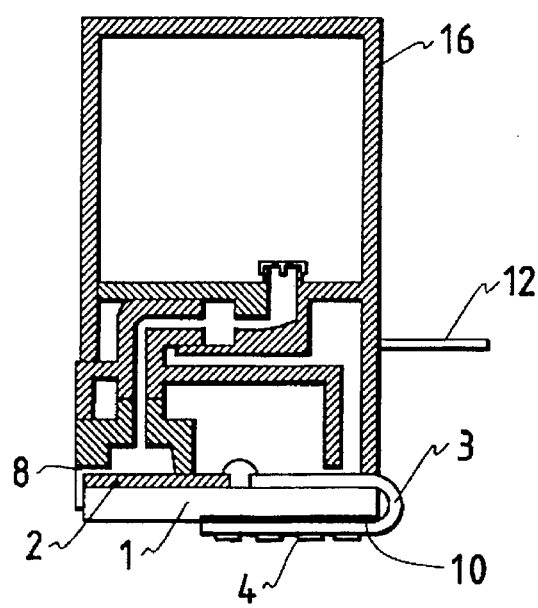
FIGS. 11A and 11B are a schematic cross-sectional view and a schematic perspective view, respectively, showing an ink jet recording head cartridge according to an embodiment of the present invention.
Figure 11B:
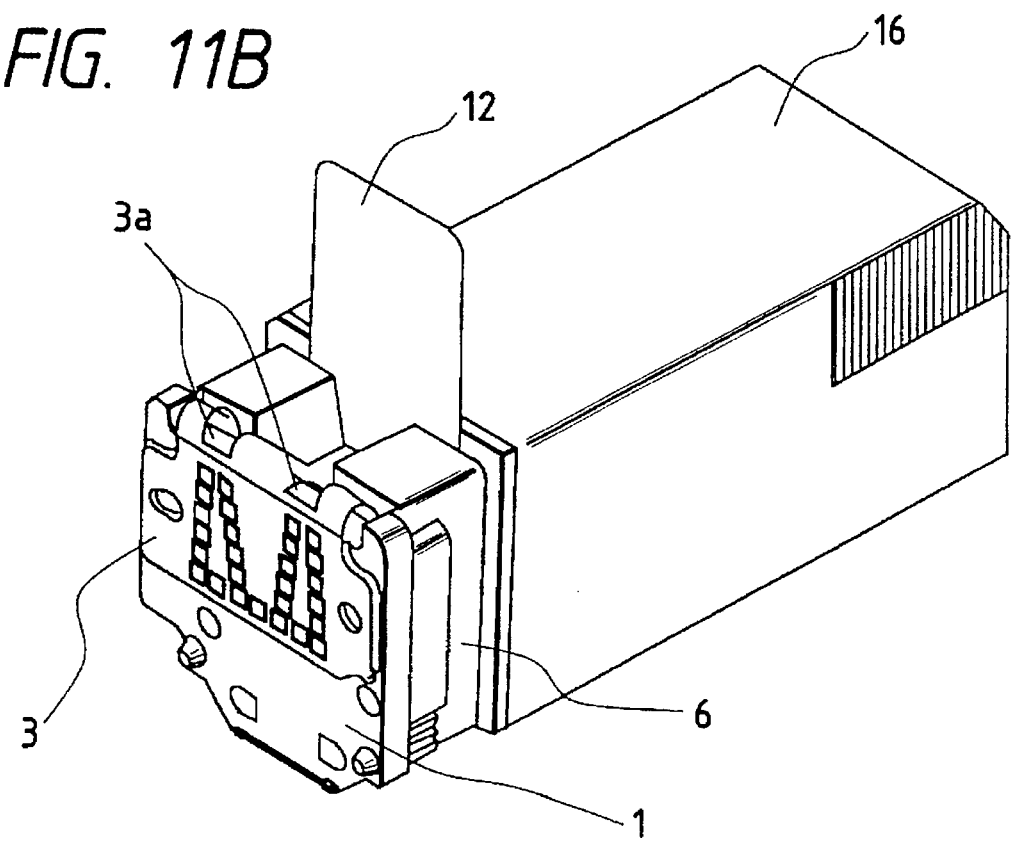

FIG. 11A shows at schematic cross-sectional view of an ink jet head cartridge in which the ink jet recording head described in the previous embodiment is connected to a removably mountable ink tank 11, and FIG. 11B shows a schematic perspective view of the ink jet head cartridge, and as shown in the previous embodiment, the recording head unit can be made compact and in accordance therewith, the ink tank can also be made compact.

Figure 12A:
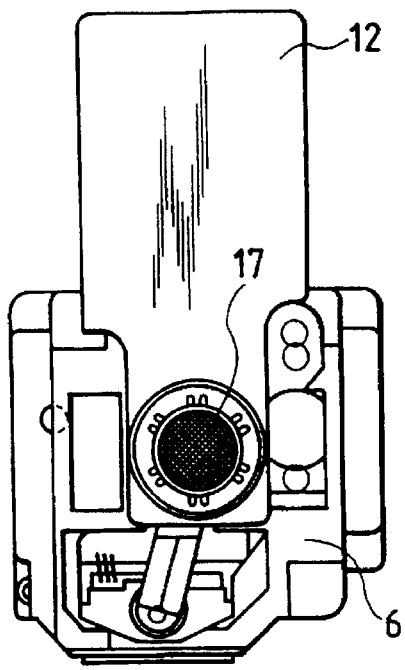
FIGS. 12A to 12C show the external appearance of an ink jet recording head according to the present invention.
Figure 12C:
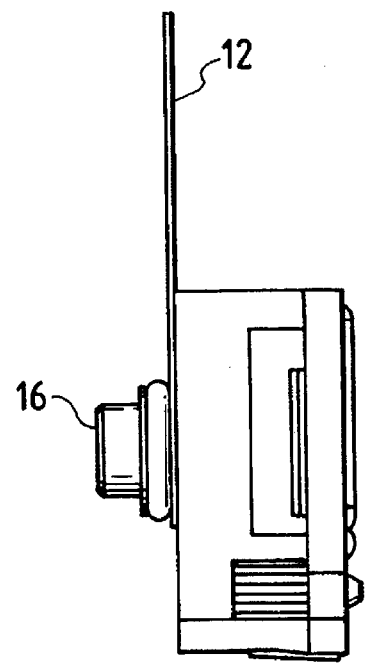
Figure 12B:
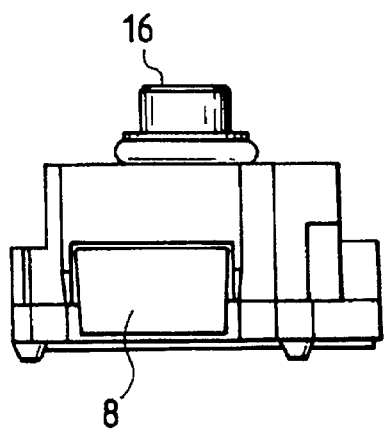

FIGS. 12A to 12C show the external appearances of the ink jet head cartridge shown in FIG. 11 with the head unit removed therefrom. FIG. 12A is a view of the head as it is seen from the ink tank side, and a filter 17 is provided in a supply portion (a tubular member having a radius of 1.75 mm) for receiving the supply of the ink from the ink tank. FIG. 12B is a view of the head as it is seen from the side of the discharge ports 8, and FIG. 12C is a side view thereof.

Figure 13A:
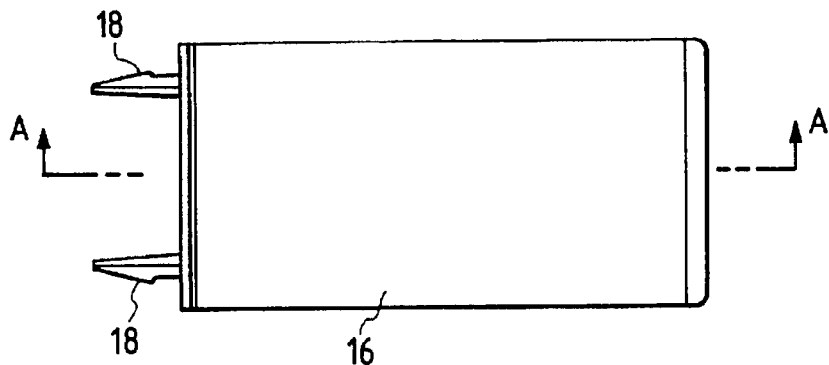
FIGS. 13A to 13D show the external appearance of an ink tank used in combination with the head of the present invention.
Figure 13B:
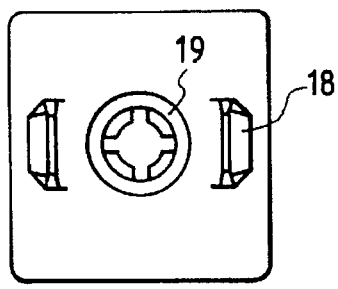
Figure 13C:
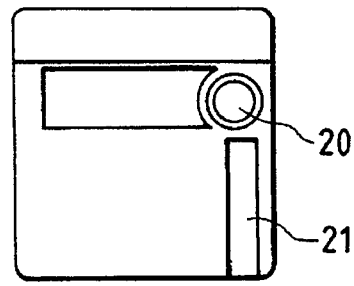
Figure 13D:
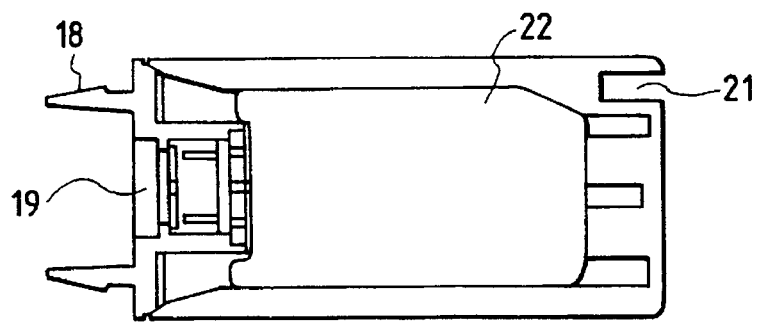

FIGS. 13A to 13D show the external appearances and cross-sectional views of the ink jet head cartridge with the ink tank portion removed therefrom. FIG. 13A is a view of the ink tank as it is seen from above it, and two coupling pawls 18 for effecting the coupling of the ink tank to the recording head are provided. FIG. 13B is a view of the head as it is seen from the direction of a supply portion 19 coupled to the head and the ink supply portion, FIG. 13C is a view of the head as it is seen from the opposite side of FIG. 11B, and the reference numeral 20 designates an atmosphere communication port for allowing the ink tank to communicate with the atmosphere, and the reference numeral 21 denotes a gap for receiving a guide portion when carried on a carriage. FIG. 13D is a cross-sectional view-of the ink tank, and an ink absorbing member 22 for retaining the ink is disposed in the ink tank.

Figure 14:
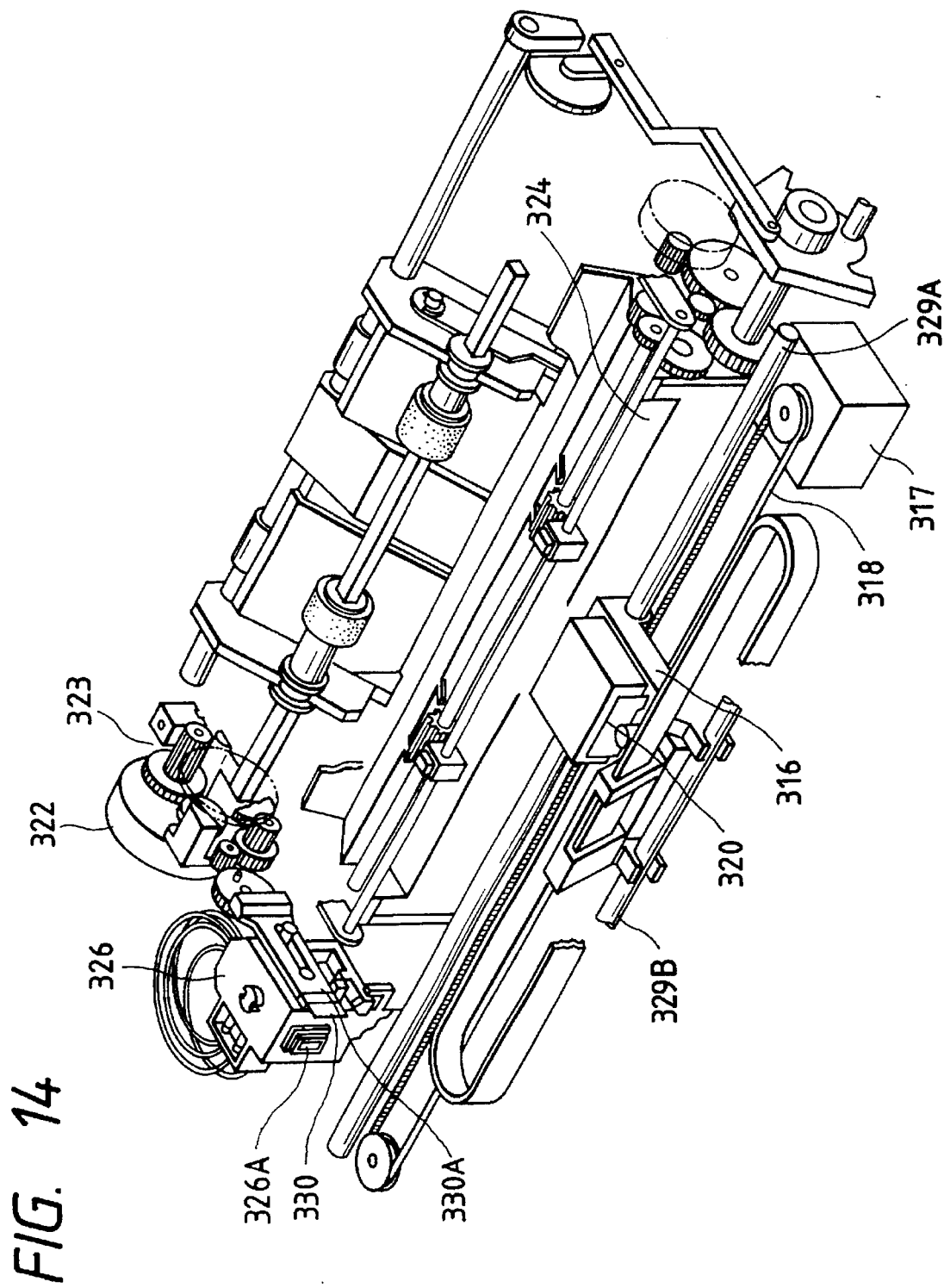
FIG. 14 is a schematic perspective view showing the essential portions of an embodiment of the ink jet recording apparatus of the present invention.

Reference is now had to FIG. 14 to describe an example of an ink jet recording apparatus having mounted thereon an ink jet recording head and an ink jet recording head cartridge manufactured by the utilization of the above-described embodiment. FIG. 14 is a schematic perspective view showing the essential portions of an example of the ink jet recording apparatus.

In FIG. 14, the reference numeral 320 designates a removable cartridge type ink jet recording head cartridge of integral recording liquid reservoir structure provided with a plurality of ink discharge ports opposed to the recording surface of recording paper (not shown) which is a recording medium conveyed onto a platen 324. The reference numeral 316 denotes a carriage for supporting the ink jet recording head cartridge 320 thereon. The carriage 316 is connected to a portion of a driving belt 318 for transmitting the drive force of a drive motor 317 and is slidable along two guide shafts 329A and 329B disposed parallel to each other. Thereby, the ink jet recording head cartridge 320 is reciprocally movable over the full width of the recording paper.

The reference numeral 326 designates a recovery device for effecting the recovery and prevention of unsatisfactory ink discharge from the recording head. The recovery device 326 is disposed at a predetermined location within the movement range of the ink jet recording head cartridge 320, for example, a location opposed to the home position. The recovery device 326 effects the capping of the discharge ports of the ink jet recording head by the drive force of a motor 322 transmitted through a transmission mechanism 323. In association with the capping operation for the discharge ports of the ink jet recording head by the cap 326A of the recovery device 326, the suction of ink from the discharge ports by suitable suction means (not shown)

provided in the recovery device 326 is effected, or in a form of apparatus (not shown) wherein ink is supplied from the apparatus side to a recording head, the forced delivery of ink by suitable pressing means (not shown) provided in the ink supply path to the ink jet recording head is effected. Thereby, the ink is forced out of the discharge ports, whereby the recovery process of removing a foreign substance such as thickened ink in the discharge ports is carried out.

The reference numeral 330 denotes a blade as a wiping member disposed on a side of the recovery device 326 and formed of silicone rubber. This blade 330 is held in a cantilever fashion by a blade holding member 330A, and like the recovery device 326, it is operated by the motor 322 and transmission mechanism 323 and becomes engageable with the discharge port surface of the ink jet recording head. Thereby, at appropriate timing, for example, during the recording operation of the ink jet recording head or after the recovery process by the recovery device 326, the blade 330 can be protruded within the movement range of the ink jet recording head to thereby wipe off foreign material such as condensation, moisture or dust adhering to the discharge port surface with the movement of the ink jet recording head.

The driving of the recording paper conveying means, carriage and recovery device of this ink jet recording apparatus, and further the driving of the recording head, are controlled, for example, on the basis of a command or a signal output from control means including a CPU on the apparatus body side.

Description will now be made of the construction and electric circuit of an information processing apparatus incorporating therein the recording apparatus according to the present embodiment.

Figure 15:
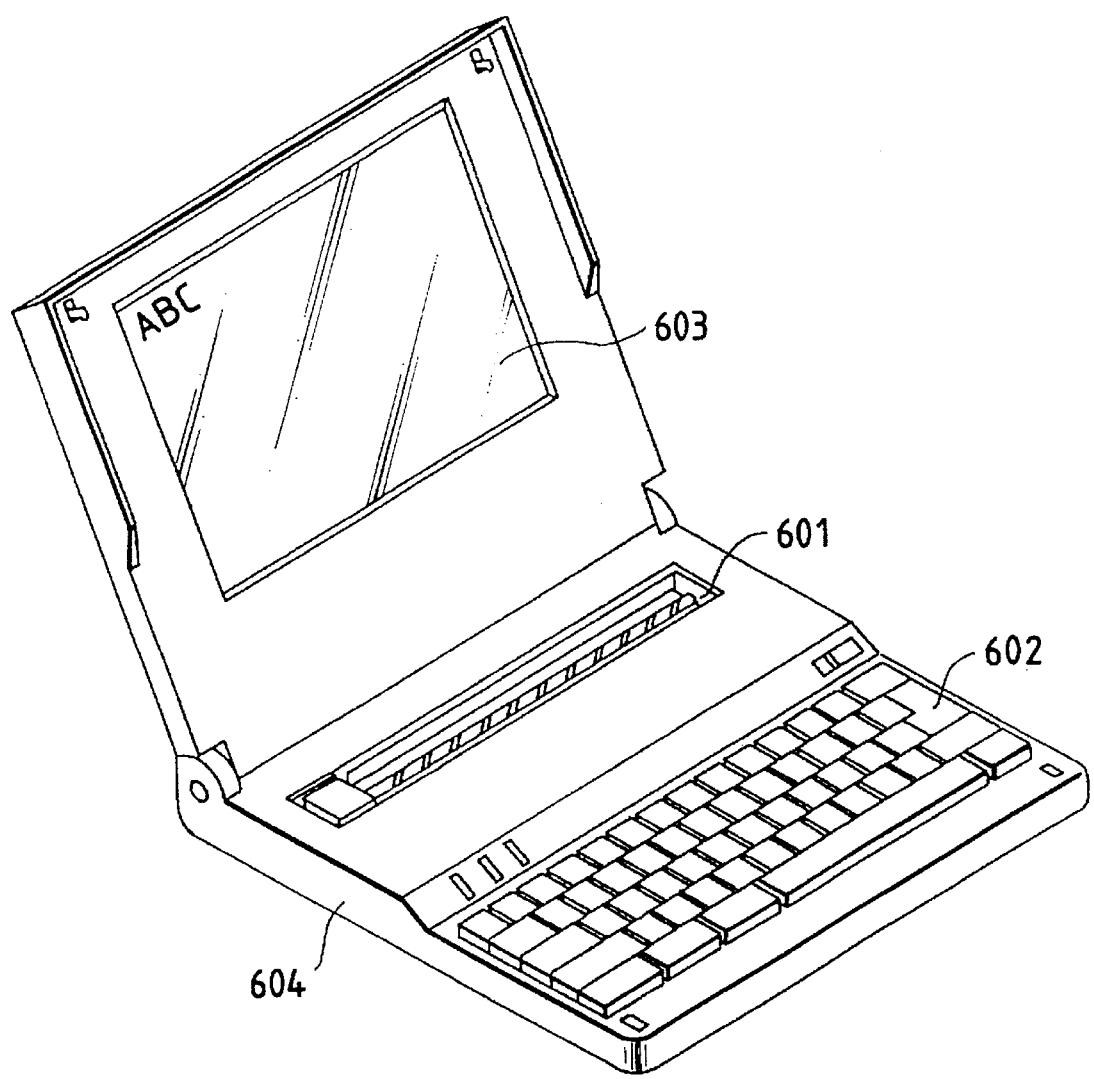
FIG. 15 is a perspective view schematically showing the external appearance of an information processing apparatus carrying the recording apparatus of the present invention thereon.

FIG. 15 is a schematic perspective view showing the external appearance of an information processing apparatus 604 incorporating therein the recording apparatus according to the present embodiment. In FIG. 15, the reference numeral 601 designates the above-described printer unit, the reference numeral 602 denotes a keyboard unit provided with keys for inputting characters and numerals, and keys for giving various commands, and the reference numeral 603 designates an indicating unit provided with an indicator.

Figure 16:
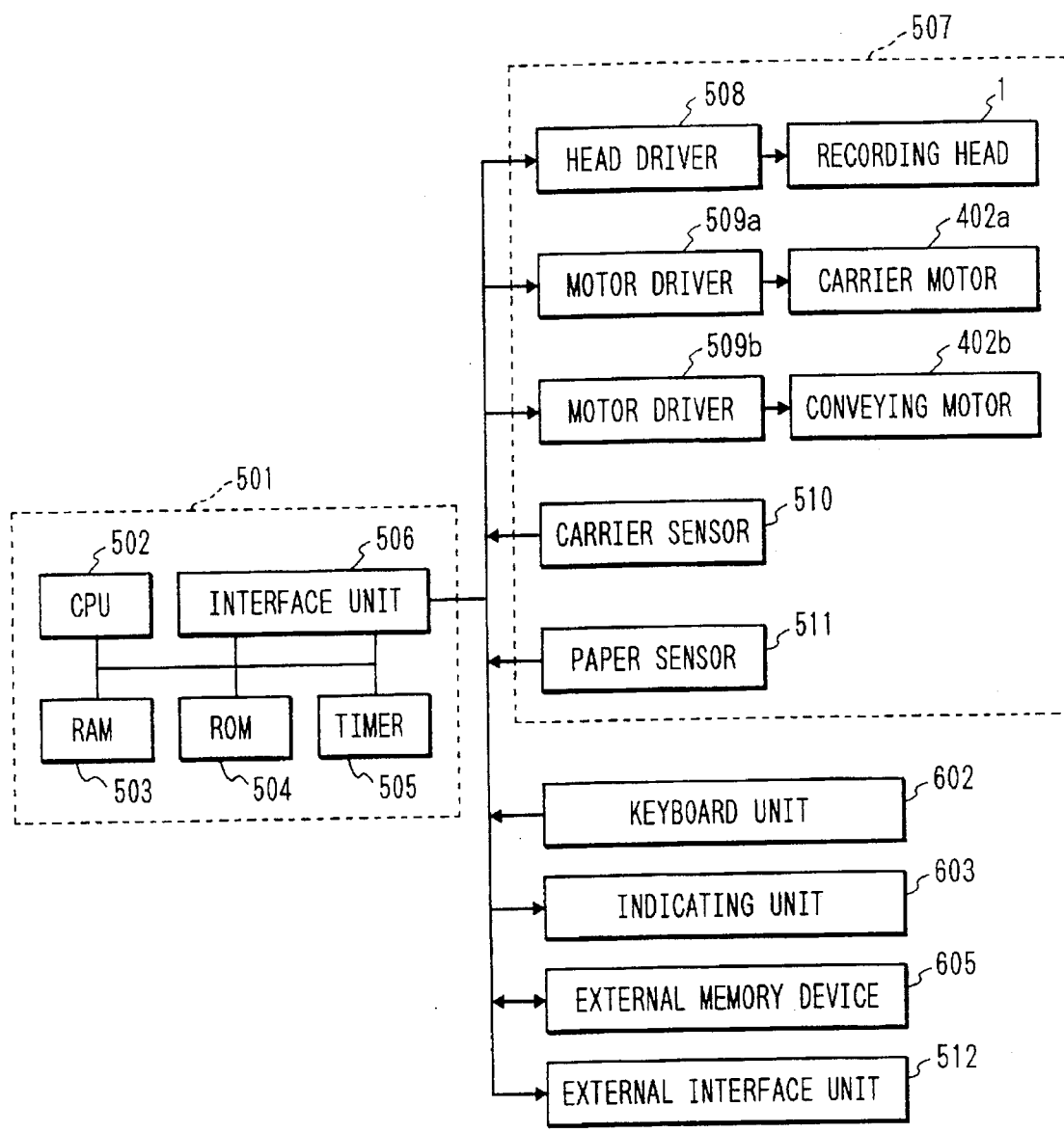
FIG. 16 is a block diagram showing the main electric circuit construction of the information processing apparatus carrying the recording apparatus of the present invention thereon.
Figure 17:
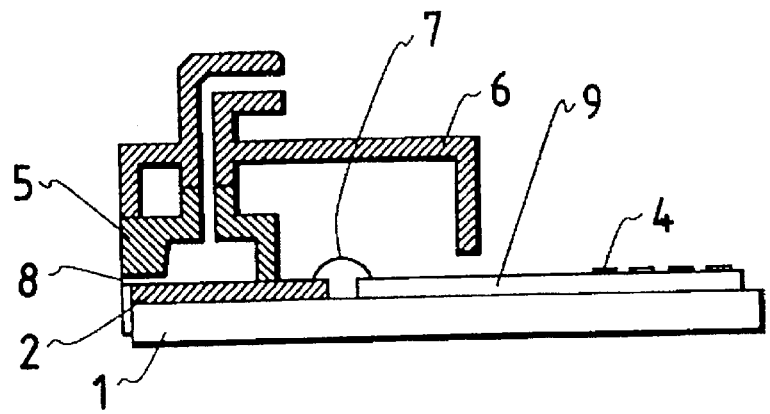
FIG. 17 is a cross-sectional view showing an ink jet recording head as the related art.
Figure 18:
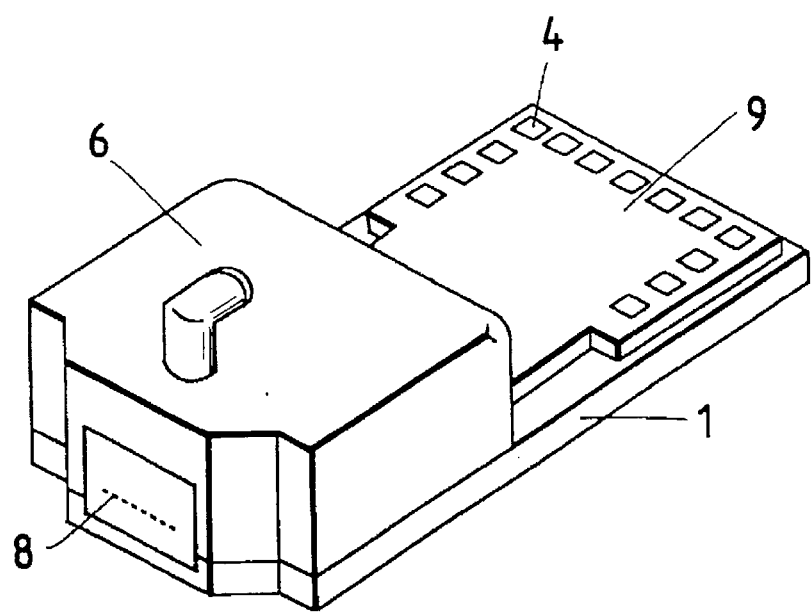
FIG. 18 is a perspective view showing an ink jet recording head as the related art.

FIG. 16 is a block diagram showing the electric circuit construction of the information processing apparatus according to the present embodiment.

In FIG. 16, the reference numeral 501 denotes a controller performing main control, the reference numeral 502 designates a CPU, for example, in the form of a microcomputer for executing a certain procedure, the reference numeral 503 denotes an RAM provided with an area for evolving text data and image data and a working area, the reference numeral 504 designates an ROM storing therein a program corresponding to said procedure and fixed data such as other font data, the reference numeral 505 denotes a timer for creating the execution cycle of the CPU 502 and creating the necessary timing during the recording operation of the printer unit 601, and the reference numeral 506 designates an interface unit for linking the signal from the CPU 502 to the surrounding devices.

The reference numeral 507 denotes a controller for the printer unit 601, the reference numeral 508 designates a head driver for delivering a recording signal and electric power to the head cartridge 101, the reference characters 509a and 509b denote motor drivers for delivering signals and electric power necessary to drive a carrier motor 402a and a conveying motor 402b, the reference numeral 510 designates a carrier sensor for detecting the position of the carrier 102 and judging whether the carrier 102 is, for example, at the home position, and the reference numeral 511 denotes a paper sensor for detecting the presence or absence of the recording medium 6 in order not to cause recording to be effected on any other surface than the recording medium 6 when the recording medium 6 is not yet inserted or when recording has been performed up to the terminal end of a page.

Further, the reference numeral 605 designates an external memory device such as PDD, HDD or a RAM card, and the reference numeral 512 denotes an external interface unit for effecting, for example, communications with other information processing apparatus, and controlling the surrounding instruments by being directly connected to an internal bus.

Although not shown in the block diagram of FIG. 16, there is a power source unit for supplying electric power to the above-described electric circuit, and this power source unit includes, for example, a battery of the charging type, a disposable dry battery or a converter for AC power source used when the information processing apparatus is fixedly used.

The present invention brings about an excellent effect particularly in a recording head and recording apparatus of the type in which heat energy is utilized to discharge ink, among ink jet recording systems.

With regard to the typical construction and principle of the present invention, it is preferable to use the basic principle disclosed, for example, in U.S. Pat. Nos. 4,723,129 and 4,740,796. This system is applicable to both of the so-called on-demand type and continuous type, and particularly in the case of the on-demand type, it is effective because at least one driving Signal corresponding to recording information and providing a rapid temperature rise exceeding nucleate boiling is applied to an electrothermal converting member disposed correspondingly to a sheet or a liquid path retaining liquid (ink) therein, thereby generating heat energy in the electro-thermal converting member and causing film boiling on the heat acting surface of a recording head with a result that a bubble can be formed in the liquid (ink) correspondingly to this driving signal at one to one. By the growth and contraction of the bubble, the liquid (ink) is discharged through a discharge opening to thereby form at least one droplet. If this driving signal is made into a pulse shape, the growth and contraction of the bubble take place appropriately on the spot and therefore, the discharge of the liquid (ink) particularly excellent in responsiveness can be accomplished, and this is more .preferable. This driving signal of the pulse shape may suitably be the one as described in U.S. Pat. Nos. 4,463,359 and 4,345,262. If the conditions described in U.S. Pat. No. 4,313,124 of an invention relating to the temperature rise rate of said heat acting surface are adopted, more excellent recording can be accomplished.

As the construction of the recording head, besides a construction comprising a combination of discharge ports, liquid paths and an electro-thermal converting member (straight liquid flow paths or right-angled liquid flow paths) as disclosed in each of the above-mentioned patents, the construction disclosed in U.S. Pat. Nos. 4,558,333 and 4,459,600 wherein a heat acting portion is disposed in a crooked area is also covered by the present invention.

Further, the recording head of the full line type having a length corresponding to the width of the largest recording medium recordable by the recording apparatus may be of the construction as disclosed in the above-mentioned patents wherein the length is satisfied by a combination of a plurality of recording heads, or of the construction as a unitarily formed recording head, and the present invention can display the above-described effect more effectively.

In addition, the present invention is also effective when use is made of a recording head of the interchangeable chip type which, by being mounted on an apparatus body, can be electrically connected to the apparatus body and can be supplied with ink from the apparatus body, or a recording head of the cartridge type which is integrally provided in the recording head itself.

Also, the addition of the recovery means, preliminary auxiliary means, etc. to the recording head which are provided as the construction of the recording apparatus of the present invention can further stabilize the effect of the present invention, and this is preferable. More specifically, these are capping means, cleaning means and pressing or suction means for the recording head, an electro-thermal converting member or a heating element discrete therefrom, or preheating means using a combination thereof, and the execution of a preliminary discharge operation in which discharge discrete from recording is effected is also effective to accomplish stable recording.

Furthermore, the recording mode of the recording apparatus is not limited to a recording mode for a principal color such as black, but the recording head may be constructed as a unit or may be provided by a combination of a plurality of heads, and the present invention is also very effective for an apparatus provided with at least one of a compound color consisting of different colors and a full color consisting of mixed colors.

The above embodiments of the present invention have been described as using liquid ink, but in the present invention, use can also be made of ink which is solid at room temperature, or ink which becomes softened at room temperature. In the above-described ink jet apparatus, it is usual to adjust the temperature of the ink itself within a range of 30° C. to 70° C., thereby controlling the viscosity of the ink so as to be within a stable discharge range. Therefore, in such an ink jet apparatus, use can be made of ink which is in liquid phase during the use of the apparatus when a recording signal is imparted. In addition, in order to make heat energy used positively as energy for the phase change of ink from its solid state to its liquid state to thereby prevent the temperature rise of the head otherwise caused by the heat energy, or in order to solidify ink as it is left unused to thereby prevent the evaporation of the ink, ink which is liquefied only by heat energy such as ink which is liquefied and discharged in its liquid state by heat energy being imparted thereto in conformity with a recording signal, or ink which begins to solidify at a point of time whereat it arrives at a recording medium is also usable in the present invention.

In the above-described embodiments, among ink jet recording heads, particularly a recording head of a form which utilizes heat energy to bubble the ink and discharges ink droplets has been shown, but the present invention can also suitably be applied to recording heads of other types, for example, a recording head of a form which uses an electrostrictive element or the like to discharge ink droplets.

Furthermore, the recording apparatus of the present invention is not limited to the form of an apparatus provided integrally or discretely as the output end of an information processing apparatus such as a word processor or a computer as previously described, but may also assume the form of a copying apparatus combined with a scanner, or a facsimile apparatus having the signal transmitting and receiving functions.

Also, the contact pad portion can be disposed on the opposite side to the ink joint portion and therefore, the contamination of the contact pad portion by the ink can be prevented.

Also, polyimide film synthesized by the polycondensation of biphenyl tetracarboxylic acid dianhydride and diamine is used as the base material of the flexible wiring substrate and a phenol nitrile rubber adhesive agent is used for the joint of the polyimide film and the reinforcing plate, whereby the ink resisting property of the polyimide film of the flexible wiring substrate and the adhesive layer is enhanced, and even when the ink adheres thereto, the flexible wiring substrate does not peel and thus, the flexible wiring substrate can be disposed to the vicinity of the ink discharge ports, and further compactness of the recording head can be achieved.

Also, the enhanced ink resisting property of the ink jet recording head permits, for example, the use of ink of higher alkali content than before and thus, the selection range of ink widens and recording of high quality images becomes possible.

Further, the polyimide film used in the present invention, as compared with conventional polyimide film, has features such as high hardness, low water absorbing property and high heat resistance and therefore, the reliability of wire bonding is also enhanced.

What is claimed is:

1. An ink jet recording head for discharging an ink from a plurality of discharge ports to thereby effect recording, comprising:

an element substrate, which is disposed on a one surface of a support member and has energy generating means for generating energy to discharge the ink in conformity with a recording signal to act on the ink;

a flexible wiring substrate for transmitting said recording signal to said element substrate, said flexible wiring substrate having a first portion, which is provided with a first connecting terminal that electrically connects said flexible wiring substrate to said element substrate and is disposed on said one surface of the support member, and a second portion, which is provided with a second connecting terminal that electrically connects said flexible wiring substrate to an apparatus and is disposed on a back side surface of said one surface of said support member by said flexible wiring substrate being bent so as to have a bent portion, the bent portion of said flexible wiring substrate having a slit portion which alleviates a bending reaction force of said flexible wiring substrate itself; and a supply portion for receiving ink to be discharged through said discharge ports from an ink tank, said supply portion being provided on the side of said one surface.

2. An ink jet recording head cartridge, comprising:

an ink jet recording head for discharging an ink from a plurality of discharge ports to thereby effect recording, including:

an element substrate, which is disposed on a one surface of a support member and has energy generating means for generating energy to discharge the ink in conformity with a recording signal to act on the ink;

a flexible wiring substrate for transmitting said recording signal to said element substrate, said flexible wiring substrate having a first portion, which is provided with a first connecting terminal that electrically connects said flexible wiring substrate to said element substrate and is disposed on said one surface of the support member, and a second portion, which is provided with a second connecting terminal that electrically connects said flexible wiring substrate to an apparatus and is disposed on a back side surface of said one surface of said support member by said flexible wiring substrate being bent so as to have a bent portion, the bent portion of said flexible wiring substrate having a slit portion which alleviates a bending reaction force of said flexible wiring substrate itself; and a supply portion for receiving ink to be discharged through said discharge ports from an ink tank, said supply portion being provided on the side of said one surface; and said ink tank removably mountable to said recording head.

3. An ink jet recording apparatus comprising:

an ink jet recording head for discharging an ink from a plurality of discharge ports to thereby effect recording, including:

an element substrate, which is disposed on a one surface of a support member and has energy generating means for generating energy to discharge the ink in conformity with a recording signal to act on the ink;

a flexible wiring substrate for transmitting said recording signal to said element substrate, said flexible wiring substrate having a first portion, which is provided with a first connecting terminal that electrically connects said flexible wiring substrate to said element substrate and is disposed on said one surface of the support member, and a second portion, which is provided with a second connecting terminal that electrically connects said flexible wiring substrate to an apparatus and is disposed on a back side surface of said one surface of said support member by said flexible wiring substrate being bent so as to have a bent portion, the bent portion of said flexible wiring substrate having a slit portion which alleviates a bending reaction force of said flexible wiring substrate itself; and a supply portion for receiving ink to be discharged through said discharge ports from an ink tank, said supply portion being provided on the side of said one surface; and a connecting terminal portion for effecting the connection with said connecting terminal disposed on a surface differing from the surface of the support member of said ink jet recording head on which said element substrate is disposed.

4. An ink jet recording head comprising:

an element substrate, which is disposed on a one surface of a support member and has energy generating means for generating energy to discharge an ink from a plurality of discharge ports in conformity with a recording signal to thereby effect recording on a recording medium to act on the ink;

a flexible wiring substrate for transmitting said recording signal from a recording apparatus body to said element substrate through a connecting terminal, said flexible wiring substrate also being disposed on said support member, wherein said flexible wiring substrate is bent and dual-sided adhesive film having adhesive on both sides is stuck on the side surface of the surface where said element substrate is disposed in such a manner that the connecting terminal is disposed on a side opposite to that surface of the support member on which said element substrate is disposed, and the support member and the flexible wiring substrate are positioned and fixed with the dual-sided adhesive film interposed therebetween; and a supply portion for receiving ink to be discharged through said discharge ports from an ink tank, said supply portion being provided on the side of said one surface.

5. An ink jet recording head according to claim 4, characterized in that the both-side adhesive film is formed of an acryl jointing material.

6. An ink jet recording head according to claim 5, characterized in that the both-side adhesive film is of three-layer structure using a discrete member as an intermediate layer.

7. An ink jet recording head according to any of claims 4 to 6, wherein the flexible wiring substrate comprises a base material, and said base material comprises a polyimide film synthesized by polycondensation of biphenyl tetracarboxylic acid dianhydride and diamine.

8. An ink jet recording head according to any of claims 4 to 6, characterized in that a reinforcing plate is joined to the joint surface between the flexible wiring substrate and the support member, and said reinforcing plate and said flexible wiring substrate are joined together by a phenol nitrile rubber adhesive agent.

9. An ink jet recording head according to any of claims 4 to 8, wherein the energy generating means is an electrothermal converting member which generates heat as a result of an application of electrical energy thereto, so as to cause a state change in the ink to thereby effect the discharge of the ink.

10. An ink jet recording head according to claim 7, characterized in that a reinforcing plate is jointed to the joint surface between the flexible wiring substrate and the support member, and said reinforcing plate and said flexible wiring substrate are joined together by a phenol nitrile rubber adhesive agent.

11. An ink jet recording head according to claim 7, wherein the energy generating means is an electro-thermal converting member which generates heat as a result of an application of electrical energy thereto, so as to cause a state change in the ink to thereby effect the discharge of the ink.

12. An ink jet recording head according to claim 10, wherein the energy generating means is an electro-thermal converting member which generates heat as a result of an application of electrical energy thereto, so as to cause a state change in the ink to thereby effect the discharge of the ink.

13. An ink jet recording head according to claim 8, wherein the energy generating means is an electro-thermal converting member which generates heat as a result of an application of electrical energy thereto, so as to cause a state change in the ink to thereby effect the discharge of the ink.

* * * * *

UNITED STATES PATENT AND TRADEMARK OFFICE
CERTIFICATE OF CORRECTION

PATENT NO. : 5,652,608

DATED : July 29, 1997

INVENTOR(S): KENJIRO WATANABE ET AL.

It is certified that error appears in the above-identified patent and that said Letters Patent is hereby corrected as shown below:

ON THE TITLE PAGE AT [57] IN THE ABSTRACT

Line 4, "discharting" should read --discharging--;
Line 19, "an" should read --such an--.

COLUMN 2

Line 5, "(Wiring" should read --(wiring--;
Line 37, "problems left to be solved," should read --remaining problems,--;
Line 45, "inventor's should read --inventors'--;
Line 64, "a" should be deleted.

COLUMN 3

Line 11, "ink" should read --an ink--;
Line 12, "such" should read --such a--;
Line 13, "such" should read --such a--;
Line 46, "both the" should read --both-side--.

COLUMN 4

Line 4, "said" should read --the--.

COLUMN 5

Line 53, "through" should read --discharged through--.

UNITED STATES PATENT AND TRADEMARK OFFICE
CERTIFICATE OF CORRECTION

PATENT NO. : 5,652,608

DATED : July 29, 1997

INVENTOR(S): KENJIRO WATANABE ET AL.

Page 2 of 3

It is certified that error appears in the above-identified patent and that said Letters Patent is hereby corrected as shown below:

COLUMN 6

Line 25, "and" should read --is--.

COLUMN 7

Line 38, "Described" should read --Description--.

COLUMN 8

Line 2, "Contact" should read --contact--.

COLUMN 9

Line 44, "dyamine," should read --diamine,--;
Line 52, "Ordinary" should read --ordinary--;
Line 62, "or the" should read --or to--.

COLUMN 10

Line 27, "FIG. 11B," should read --FIG. 13B,--;
Line 32, "view-of" should read --view of--;
Line 35, "had" should read --made--;
Line 53, "receip-" should read --recip--.

UNITED STATES PATENT AND TRADEMARK OFFICE
CERTIFICATE OF CORRECTION

PATENT NO. : 5,652,608

DATED : July 29, 1997

INVENTOR(S): KENJIRO WATANABE ET AL.

It is certified that error appears in the above-identified patent and that said Letters Patent is hereby corrected as shown below:

COLUMN 12

Line 10, "PDD," should read --FDD,--.
Line 32, "Signal" should read --signal--;
Line 34, "electrothermal" should read --electro-thermal--.

COLUMN 16

Line 32, "8," should read --6,--.

Signed and Sealed this

Fourteenth Day of April, 1998

Attest:

BRUCE LEHMAN

Attesting Officer     Commissioner of Patents and Trademarks